United States Patent [19]

Meyer

[11] Patent Number: 5,627,498

[45] Date of Patent: May 6, 1997

[54] MULTIPLE FREQUENCY OSCILLATOR

[75] Inventor: Charles S. Meyer, Nevada City, Calif.

[73] Assignee: Nvision, Inc., Grass Valley, Calif.

[21] Appl. No.: 598,953

[22] Filed: Feb. 9, 1996

[51] Int. Cl.$^6$ .................................................. H03L 7/16
[52] U.S. Cl. ........................... 331/117 R; 331/177 V;
 331/158; 331/116 R
[58] Field of Search ............................ 331/117 R, 49,
 331/177 V, 179, 117 FE, 116 FE, 167,
 168, 116 R, 158, 159

[56] References Cited

U.S. PATENT DOCUMENTS 4,821,001  4/1989  Hattori ........................ 331/158

Primary Examiner—Robert Pascal
Assistant Examiner—An T. Luu
Attorney, Agent, or Firm—Smith-Hill and Bedell

[57] ABSTRACT

An oscillator comprises a first inverter provided with a resonant feedback circuit, a second inverter having its signal input terminal at the same DC level as the signal input terminal of the first inverter, and a current source having a current supply terminal connected to the power supply terminals of the first and second inverters.

18 Claims, 2 Drawing Sheets

5,627,498

1

MULTIPLE FREQUENCY OSCILLATOR

BACKGROUND OF THE INVENTION

This invention relates to an oscillator, and more particularly, but not exclusively, to a multiple frequency oscillator.

There are many applications for an oscillator that operates at a precisely controlled frequency. Radio devices, such as radio sets and radio controlled toys employ an oscillator to generate a signal for demodulating an RF signal received by the radio device. In such radio devices, the oscillation frequency is set by a crystal and it is necessary to remove the crystal in order to change the oscillation frequency.

Digital frequency synthesis, in which a model signal is sampled at a first clock frequency and reconstructed using a second clock frequency, is used in spectrum oscillators for generating a replica of the model signal at any one of several precisely controlled frequencies, but is a rather expensive solution to the problem of providing multiple frequencies when it is only necessary to provide a choice among a small number of different frequencies.

Other circuits used for operating at a selected one of multiple frequencies are difficult to manufacture because they are very sensitive to component variations.

SUMMARY OF THE INVENTION

In accordance with a first aspect of the invention there is provided an oscillator comprising a first inverter having a signal input terminal, a signal output terminal, and a power supply terminal, a second inverter having a signal input terminal, a signal output terminal, and a power supply terminal, a DC bias means for maintaining the signal input terminal of the second inverter at the same DC level as the signal input terminal of the first inverter, a feedback network connected between the signal output terminal of the first inverter and the signal input terminal thereof, said feedback network having a resonant frequency, and a current source means having a current supply terminal connected to the power supply terminal of the first inverter and to the power supply terminal of the second inverter.

In accordance with a second aspect of the invention there is provided a multiple frequency oscillator including a first mirror circuit and a second mirror circuit, and wherein each of said first and second mirror circuits comprises a first inverter having a signal input terminal, a signal output terminal, and a power supply terminal, a second inverter having a signal input terminal, a signal output terminal, and a power supply terminal, the power supply terminal of the first inverter and the power supply terminal of the second inverter being each connected to a current supply terminal of the mirror circuit, a DC bias means for maintaining the signal input terminal of the second inverter at the same DC level as the signal input terminal of the first inverter, and a feedback network connected between the signal output terminal of the first inverter and the signal input terminal thereof, said feedback network having a resonant frequency, and the oscillator further includes a current source and a means for switching current supplied by the current source selectively either to the current supply terminal of the first mirror circuit or to the current supply terminal of the second mirror circuit.

BRIEF DESCRIPTION OF THE DRAWINGS

For a better understanding of the invention, and to show how the same may be carried into effect, reference will now be made, by way of example, to the accompanying drawings, in which.

In the several figures of the drawings, like reference numerals designate corresponding components.

DETAILED DESCRIPTION

Figure 1:
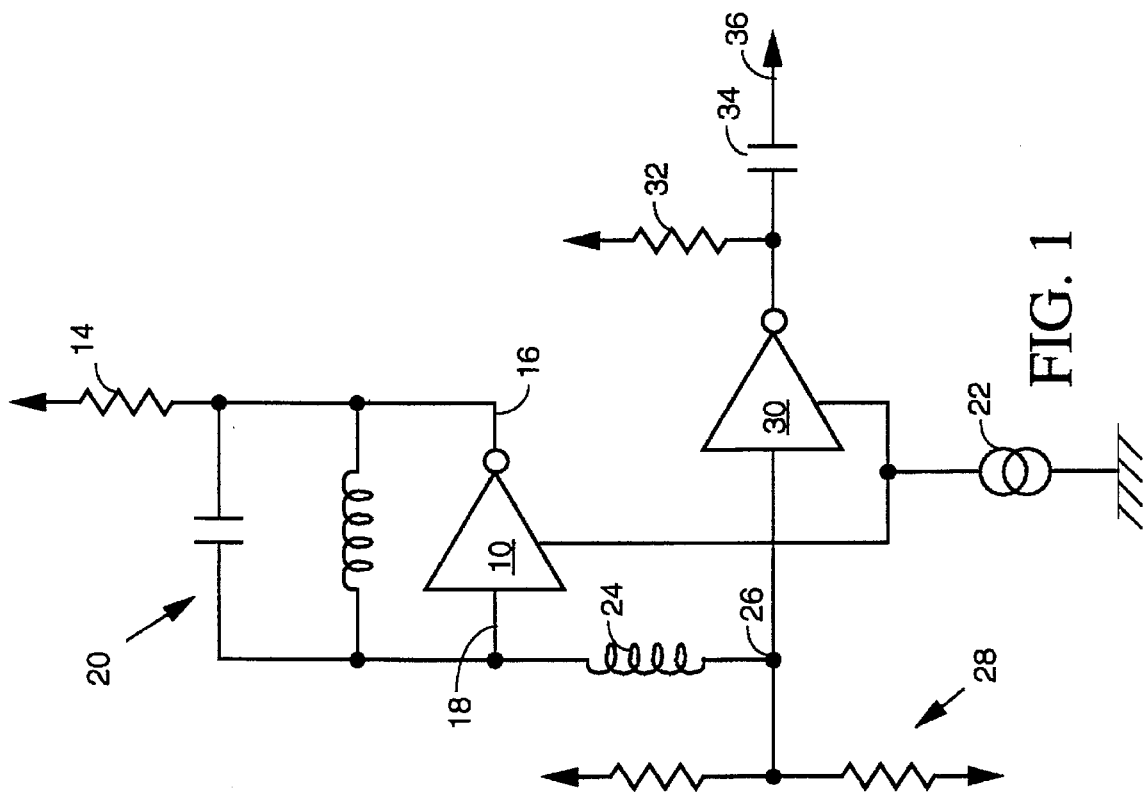
FIG. 1 is a schematic diagram of a first single frequency oscillator embodying the present invention.

The oscillator shown in FIG. 1 comprises an inverter 10 having a load resistor 14 connected to its output 16 and having a parallel LC feedback network 20 connected between its output 16 and its input 18. Operating current for the inverter 10 is supplied by a current source 22. The inverter 10 develops a voltage across the resistor 14 that oscillates at the resonant frequency of the LC network 20, in the manner of a conventional inverter oscillator.

The input 18 of the inverter 10 is connected through an inductor 24 to a node 26, which is connected to the connection point of two resistors forming a potential divider 28 between positive and negative power supply rails. The inductance value of the inductor 24 is selected so that it has a high impedance, preferably at least about 20 kohms, at the resonant frequency of the LC network 20. Accordingly, the potential at the input of the inverter 10 can vary at the resonant frequency of the LC feedback network 20 while its DC potential remains the same as that of the node 26.

The current drawn by the source 22 through the load resistor 14 sets the DC level of the terminal 16 and the potential divider 28 sets the DC level of the terminal 18. It is desirable that the DC voltage across the LC network 20 be kept to a minimum in order to minimize power dissipation in the LC circuit element and maximize inverter gain and thereby ensure reliable start up of the oscillator. Accordingly, the potential divider 28, through the inductor 24, sets the DC level of the input of the inverter 10 as close as possible to the DC level of the output.

A second inverter 30 receives operating current from the same current source 22 as the inverter 10 and has its input connected to the node 26. The output of the inverter 30 is connected across a load resistor 32 and through an AC coupling capacitor 34 to an output terminal 36.

Figure 3:
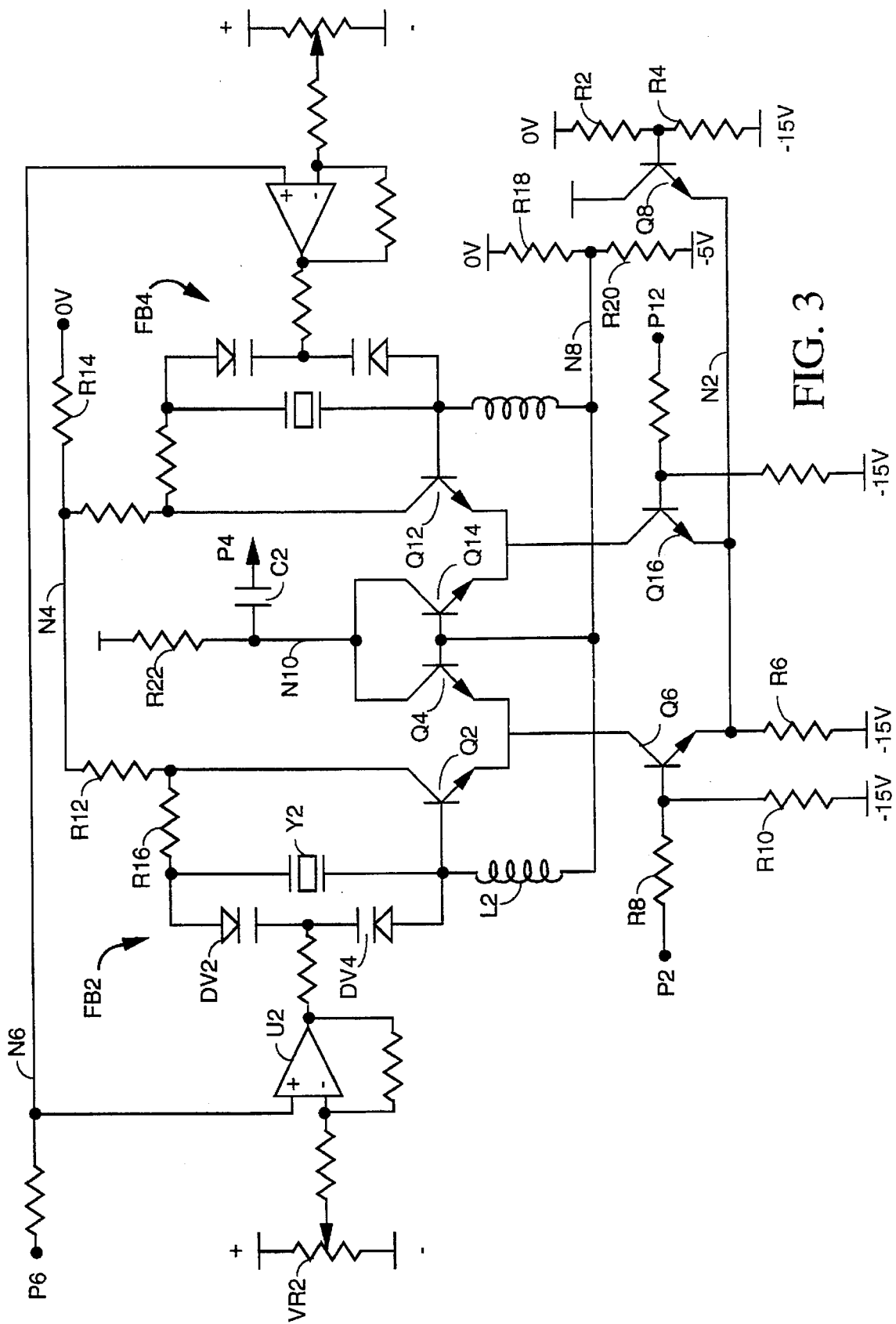
FIG. 3 is a schematic diagram of a dual frequency oscillator embodying the present invention.

The dual frequency oscillator shown in FIG. 3 comprises a differential pair of inverting transistors Q2, Q4 having their emitters connected to a node N2 through the collector-emitter path of a switching transistor Q6. An emitter follower transistor Q8 has its collector connected to ground and its base connected to the connection point of two resistors R2, R4 that are connected as a potential divider between ground and the −15 volt rail. The emitter of the transistor Q8 is connected to the node N2 and holds the node N2 at approximately −8 volts. The basis for selecting this voltage is indicated below. A current source resistor R6 is connected between the node N2 and the −15 volt rail and therefore draws a constant current. The base of the transistor Q6 is connected to the connection point of two resistors R8, R10 that are connected in series between a terminal P2 and the −15 volt rail.

The collector of the transistor Q2 is connected through a resistor R12 to a node N4, which is connected through a resistor R14 to ground, and a resonant feedback network FB2, comprising two varactor diodes DV2, DV4 connected in series, a crystal Y2 connected in parallel with the varactor diodes, and a resistor R16 connected in series with the parallel combination of the diodes DV2, DV4 and the crystal Y2, is connected between the collector and base of the transistor Q2. When the transistor Q6 is conductive, therefore, the transistor Q2 develops a voltage across the load resistors R12, R14 that oscillates at the resonant frequency of the feedback network.

A summing amplifier U2 has its inverting input terminal connected to the tap of a potentiometer VR2 and its non-inverting input terminal connected to a node N6, which is connected through a resistor to a terminal P6. The output of the summing amplifier U2 is connected to the point of connection of the varactor diodes DV2, DV4.

The base of the transistor Q4 is connected to a node N8 at the connection point of two resistors R18, R20 that form a potential divider between ground and the −5 volt rail. An The current source 22 supplies a constant current. Since the current that the inverter 10 draws from the current source 22 varies at the resonant frequency of the LC network 20 and the total current drawn by the two inverters must remain constant, the current drawn by the inverter 30 varies in complementary fashion with the current drawn by the inverter 10, and the output voltage of the inverter 30 therefore varies at the same frequency as the output voltage of the inverter 10 but is shifted in phase by 180°. The inverters 10 and 30 thus operate in differential fashion.

Since the node 26 is held at a constant potential, the DC bias potential of the input of the inverter 30 is the same as the DC bias potential of the input of the inverter 10. This ensures true differential operation of the inverters 10 and 30 and consequently the DC components of the output voltages of the two inverters also are the same.

The resistors 14 and 32 are equal valued and since the DC inputs of the two inverters are the same the DC component of the current drawn by the inverter 10 is equal to that of the current drawn by the inverter 30 and the DC level of the output of the inverter 10 is the same as that of the inverter 30. The value of the resistors 14 and 32 is selected to provide adequate headroom for the AC component of the output signal.

The oscillator shown in FIG. 1 offers the advantage that the output of the inverter 30 does not load the output of the inverter 10. Consequently, in the event that the output terminal 36 is connected to a reactive load, it does not affect the oscillation frequency.

Figure 2:
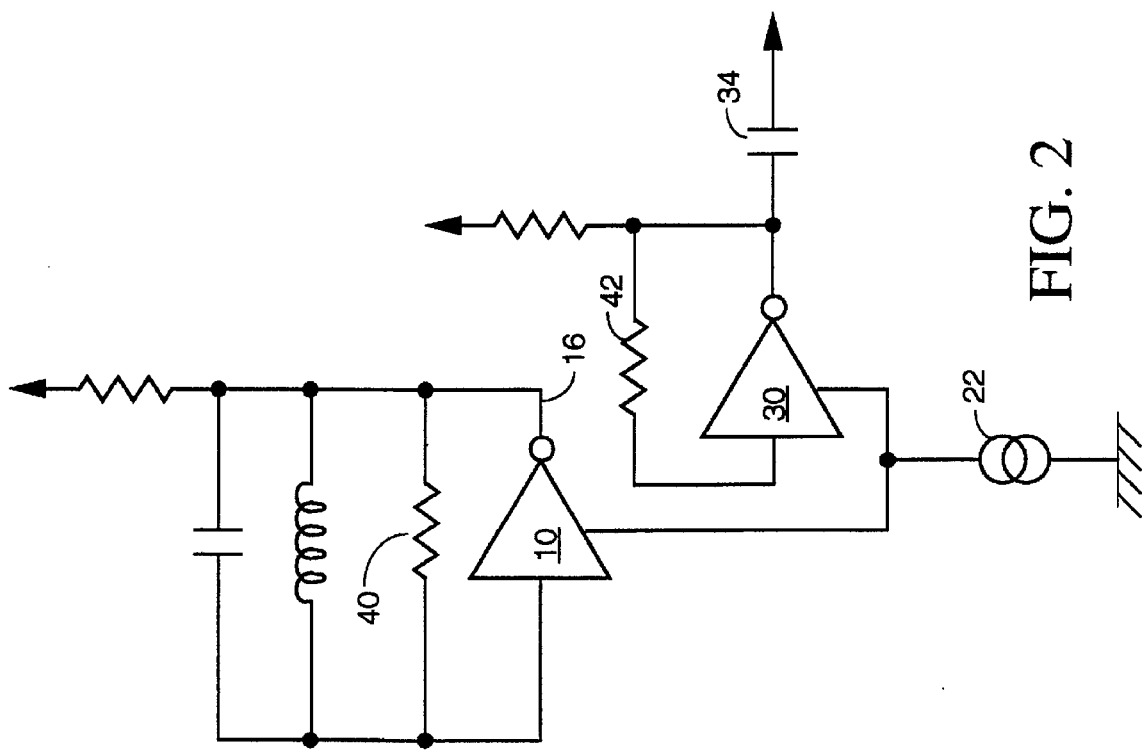
FIG. 2 is a schematic diagram of a second single frequency oscillator embodying the present invention.

FIG. 2 illustrates a modification of the oscillator shown in FIG. 1. In the case of FIG. 2, the inputs of the inverters 10 and 30 are not connected. Large resistors 40 and 42 of equal value, e.g. about 1 megohm, provide feedback for the inverters 10 and 30 in order to establish their DC bias points at the same potential. The two inverters 10 and 30 are self biased into an active region where they act as amplifiers rather than as on-off logic gates. inductor L2 having a high impedance at the resonant frequency of the feedback network FB2 is connected between the base of the transistor Q4 and the base of the transistor Q2. Thus, the DC bias levels of the two inverting transistors are essentially equal, allowing them to operate as a differential pair.

The collector of the transistor Q4 is connected to a node N10, which is connected through a load resistor to the +5 volt rail and is also connected through an AC coupling capacitor C2 to an output terminal P4.

The transistors Q2, Q4, Q6 and associated components connected to the nodes N2–N10 form a first oscillator. The terminal P2 can be set at +5 volts or ground. The action of the resistors R8, R10 translates the voltage at the terminal P2 to a voltage swing of +/−1 volt at the base of the transistor Q6, and therefore when the terminal P2 is at ground, the transistor Q6 is off and does not conduct current, whereas when the terminal P2 is at +5 volts, the transistor Q6 is conductive and supplies current to the emitters of the transistors Q2 and Q4. Thus, the oscillator is enabled when the terminal P2 is at +5 volts whereas it is disabled when the terminal P2 is at ground. It will be understood from the foregoing description of FIG. 1 that when the oscillator is enabled, it provides an output signal at the terminal P4 at a frequency that is the same as the frequency of oscillation at the collector of the transistor Q2 but is 180° out of phase therewith.

The frequency of oscillation is set by the DC bias voltage of the varactor diodes DV2, DV4, which is established by the output voltage of the summing amplifier U2. The terminal P6 is initially grounded and the potentiometer VR2 is adjusted to bring the oscillation frequency to its design value. The setting of the potentiometer VR2 thereby compensates for manufacturing variations in the characteristics of the varactor diodes and the crystal without need for a trimming capacitor.

The capacitance of a varactor diode varies with temperature as well as bias voltage. Preferably, the inverting input of the amplifier U2 is connected to a summing junction at which a temperature compensation voltage is added to the voltage supplied by the potentiometer VR2. A thermistor (not shown) generates a voltage that varies approximately linearly with temperature, and this voltage is applied to an analog function circuit, such as a logarithmic amplifier, to generate the temperature compensation voltage, which ideally varies with temperature in accordance with a function that precisely offsets the change in capacitance that would occur due to change in temperature alone. Alternatively, the output voltage from the thermistor may be applied to a digital function circuit, including an A/D converter, a lookup table, and a D/A converter, for generating the temperature compensation voltage. The temperature compensation voltage compensates for temperature variations in the capacitance of the varactor diodes DV2, DV4.

The oscillator operates either in a free running mode or as a voltage controlled oscillator in a phase locked loop. In the free running mode, the terminal P6 is grounded and the output frequency depends on the setting of the potentiometer VR2. The temperature compensation circuit ensures that the output freqency does not change with temperature. In the VCO mode, the terminal P6 is connected to the output of the loop filter of the phase locked loop and applies a voltage that tends to cause the oscillation frequency to match the frequency of an external reference signal. The phase locked loop typically does not respond to small changes in frequency such as arise due to change in temperature of the varactor diodes, and the temperature compensation circuit ensures that frequency drift due to temperature change in the oscillator is eliminated.

It is desirable that the DC level of the collector of the transistor Q2 be close to the DC level of the base of the transistor Q2 in order to minimize the power dissipation in the crystal Y2 and prevent aging of the crystal and even damage to the crystal. This is accomplished by selecting the values of the current source resistor R6 and the load resistor R12 so that the collector voltage of the transistor Q2 is close to the potential of the node N8. Since the potential of the node N8 is set by the ratio of the values of two resistors and the collector voltage of the transistor Q2 is set by the ratio of two resistors, accuracy of the design is assured and the bias voltages are rendered independent of parameters such as transistor current gain. The potential at the node N8 is selected such that at the minimum value of the output voltage of the amplifier U2, the varactors DV2 and DV4 are not forward biased, since oscillation is not possible in this condition.

A second oscillator having the same topology as that based on the transistors Q2, Q4 and Q6 is composed of transistors Q12, Q14 and Q16 (and associated components that are not specifically referenced) and is connected to the nodes N2–N10. By connecting the collectors of the transistors Q4 and Q14 to the node N10, and also connecting the bases of these transistors to the node N8, the two oscillators have the same DC bias points. The second oscillator is enabled or disabled by the voltage applied to the terminal P12. The voltage at the node N2 is halfway between the base voltages of the transistors Q6 and Q16 when the terminals P2 and P12 are at logic high (+5 volts) and logic low (0 volt) respectively, or vice versa. If the first oscillator is disabled and the second oscillator is enabled, the signal at the terminal P4 is at the resonant frequency of the feedback network FB4 of the transistor Q12. By adding three more transistors and associated components connected to the nodes N2–N10, the oscillator can be expanded to a third frequency, and so on.

The circuit shown in FIG. 3 has only a small number of components and therefore it is insensitive to parasitic effects. The only necessary capacitance is in the varactor diodes themselves and so the circuit is independent of capacitor tolerances:

It will be appreciated that the invention is not restricted to the particular embodiment that has been described, and that variations may be made therein without departing from the scope of the invention as defined in the appended claims and equivalents thereof.

I claim:

1. An oscillator comprising:
   a first inverter having a signal input terminal, a signal output terminal, and a power supply terminal,
   a second inverter having a signal input terminal, a signal output terminal, and a power supply terminal,
   a DC bias means for maintaining the signal input terminal of the second inverter at the same DC level as the signal input terminal of the first inverter,
   a feedback network connected between the signal output terminal of the first inverter and the signal input terminal thereof, said feedback network having a resonant frequency, and
   a current source means having a current supply terminal connected to the power supply terminal of the first inverter and to the power supply terminal of the second inverter.

2. An oscillator according to claim 1, wherein the DC bias means comprises a means for biasing the signal input terminals of the first and second inverters to a selected DC level.

3. An oscillator according to claim 1, wherein the DC bias means comprises an inductor connected between the signal input terminal of the second inverter and the signal input terminal of the first inverter, the inductor having an impedance of at least about 20 kohms at the resonant frequency of the feedback circuit.

4. An oscillator according to claim 1, wherein the DC bias means comprises a means for biasing the signal input terminal of the second inverter to a selected DC bias level and an inductor connected between the signal input terminal of the second inverter and the signal input terminal of the first inverter, the inductor having an impedance of at least about 20 kohms at the resonant frequency of the feedback network.

5. An oscillator according to claim 1, wherein the first inverter comprises a first bipolar transistor and the second inverter comprises a second bipolar transistor.

6. An oscillator according to claim 5, wherein the current source means comprises a resistor and a third bipolar transistor, whereby the current provided by the current source means can be interrupted.

7. An oscillator according to claim 6, comprising an emitter follower transistor having its emitter connected to the emitter of the third transistor for establishing the base voltage at which the third transistor turns on and off.

8. An oscillator according to claim 1, wherein the feedback network includes a variable capacitance means.

9. An oscillator according to claim 8, further comprising a means for adjusting the capacitance of the variable capacitance means.

10. An oscillator according to claim 9, wherein the capacitance of the variable capacitance means is dependent on voltage applied to a terminal of the variable capacitance means and the means for adjusting capacitance of the variable capacitance means comprises an operational amplifier having an output terminal connected to said terminal of the variable capacitance means, and a means for providing a selectively variable input voltage to the operational amplifier, whereby the capacitance of the variable capacitance means depends on the input voltage provided to the operational amplifier.

11. An oscillator according to claim 10, wherein the means for providing a selectively variable input voltage to the operational amplifier comprises a potentiometer.

12. An oscillator according to claim 10, wherein the variable capacitance means comprises first and second variable capacitance diodes connected in series with the cathode of the first variable capacitance diode and the cathode of the second variable capacitance diode each connected to said terminal.

13. A multiple frequency oscillator including a first mirror circuit and a second mirror circuit, and wherein each of said first and second mirror circuits comprises a first inverter having a signal input terminal, a signal output terminal, and a power supply terminal, a second inverter having a signal input terminal, a signal output terminal, and a power supply terminal, the power supply terminal of the first inverter and the power supply terminal of the second inverter being each connected to a current supply terminal of the mirror circuit, a DC bias means for maintaining the signal input terminal of the second inverter at the same DC level as the signal input terminal of the first inverter, and a feedback network connected between the signal output terminal of the first inverter and the signal input terminal thereof, said feedback network having a resonant frequency, and the oscillator further includes a current source and a means for switching current supplied by the current source selectively either to the current supply terminal of the first mirror circuit or to the current supply terminal of the second mirror circuit.

14. A multiple frequency oscillator according to claim 13, wherein the feedback circuit of each of the first and second mirror circuits includes a variable capacitance means.

15. An oscillator according to claim 14, further comprising a means for adjusting the capacitance of each variable capacitance means.

16. An oscillator according to claim 15, wherein the capacitance of each variable capacitance means is dependent on voltage applied to a terminal of the variable capacitance means and the means for adjusting capacitance of the variable capacitance means comprises an operational amplifier having an output terminal connected to said terminal of the variable capacitance means, and a means for providing a selectively variable input voltage to the operational amplifier, whereby the capacitance of the variable capacitance means depends on the input voltage provided to the operational amplifier.

17. An oscillator according to claim 16, wherein the means for providing a selectively variable input voltage to the operational amplifier comprises a potentiometer.

18. An oscillator according to claim 17, wherein the operational amplifiers are summing amplifiers and each has a first input terminal connected to the means for providing a selectively variable input voltage and a second input terminal connected to a common control terminal, whereby each variable capacitance means receives a voltage that is equal to the sum of a common voltage, present at the common control terminal, and a voltage that depends on the means for providing a selectively variable input voltage.

* * * * *